(12) United States Patent
Kyogoku et al.

(10) Patent No.: US 10,304,950 B2
(45) Date of Patent: May 28, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Shinya Kyogoku, Nagareyama (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/692,935

(22) Filed: Aug. 31, 2017

(65) Prior Publication Data

US 2018/0158938 A1 Jun. 7, 2018

(30) Foreign Application Priority Data

Dec. 7, 2016 (JP) .................................. 2016-237583

(51) Int. Cl.
*H01L 21/331* (2006.01)
*H01L 29/739* (2006.01)
(Continued)

(52) U.S. Cl.
CPC ...... *H01L 29/7397* (2013.01); *H01L 29/1095* (2013.01); *H01L 29/4236* (2013.01);
(Continued)

(58) Field of Classification Search
CPC ............ H01L 29/1095; H01L 29/7397; H01L 29/42376; H01L 29/7813; H01L 29/4236;
(Continued)

(56) References Cited

U.S. PATENT DOCUMENTS

2012/0052642 A1 3/2012 Endo et al.
2016/0043205 A1* 2/2016 Kamata ............... H01L 29/7395
257/139

FOREIGN PATENT DOCUMENTS

JP 2012-54347 3/2012
JP 2012-209344 10/2012
(Continued)

OTHER PUBLICATIONS

Hidefumi Takaya, et al., "A 4H—SiC Trench MOSFET with Thick Bottom Oxide for Improving Characteristics", Proceedings of the 25th International Symposium on Power Semiconductor Devices & ICs, Kanazawa DOI: 10.1109/ISPD.2013.6694394, 2013, 4 Pages.

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor device includes a first electrode, a semiconductor layer, and a first insulating portion. The first electrode includes first and second electrode regions. The semiconductor layer includes first to third semiconductor regions, and third and fourth partial regions. The first semiconductor region includes first and second partial regions. The first partial region is separated from the first electrode region. The second semiconductor region is separated from the second partial region. The third semiconductor region is provided between the second partial region and the second semiconductor region. The third partial region is separated from the second electrode region. The fourth partial region is separated from the second electrode region. The first insulating portion is provided between the electrode region and the partial region and between the electrode region and the semiconductor region. The first insulating portion has a first width and a second width.

20 Claims, 15 Drawing Sheets

(51) Int. Cl.
*H01L 29/423* (2006.01)
*H01L 29/10* (2006.01)
*H01L 29/66* (2006.01)
*H01L 29/78* (2006.01)
*H01L 29/16* (2006.01)
*H01L 21/04* (2006.01)

(52) U.S. Cl.
CPC .. *H01L 29/42368* (2013.01); *H01L 29/42376* (2013.01); *H01L 29/66068* (2013.01); *H01L 21/049* (2013.01); *H01L 21/0475* (2013.01); *H01L 29/1608* (2013.01); *H01L 29/7813* (2013.01)

(58) Field of Classification Search
CPC ......... H01L 29/66348; H01L 29/66333; H01L 29/7395; H01L 29/7393; H01L 21/82285; H01L 27/0647; H01L 27/0823; H01L 27/1022; H01L 27/088
See application file for complete search history.

(56) References Cited

FOREIGN PATENT DOCUMENTS

| | | |
|---|---|---|
| JP | 2013-214661 | 10/2013 |
| JP | 2016-48747 | 4/2016 |

* cited by examiner

… (1)

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2016-237583, filed on Dec. 7, 2016; the entire contents of which are incorporated herein by reference.

FIELD

Embodiments described herein relate generally to a semiconductor device and a method for manufacturing the same.

BACKGROUND

It is desirable to improve the insulative characteristics of a semiconductor device.

Figure 1A:
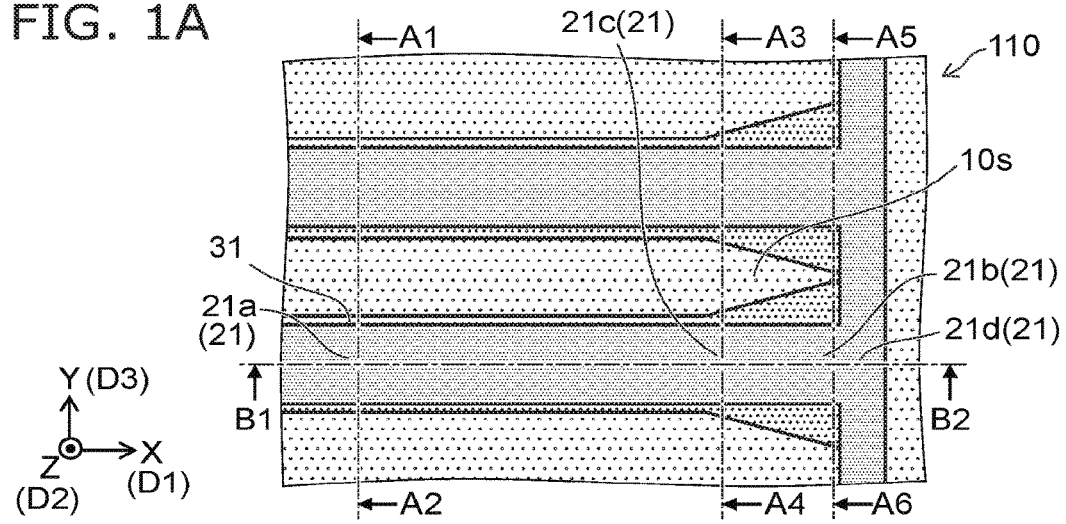
FIG. 1A to FIG. 1D are schematic views illustrating a semiconductor device according to a first embodiment.

According to one embodiment, a semiconductor device includes a first electrode, a semiconductor layer, and a first insulating portion. The first electrode extends along a first direction and includes a first electrode region and a second electrode region. A direction connecting the first electrode region and the second electrode region is along the first direction. The semiconductor layer includes first to third semiconductor regions, and third and fourth partial regions. The first semiconductor region includes a first partial region and a second partial region and is of a first conductivity type. The first partial region is separated from the first electrode region in a second direction crossing the first direction. A direction connecting the first partial region and the second partial region is aligned with a third direction crossing the first direction and the second direction. The second semiconductor region is separated from the second partial region in the second direction, and is of the first conductivity type. The third semiconductor region is provided between the second partial region and the second semiconductor region in the second direction, and is of a second conductivity type. The third partial region is separated from the second electrode region in the second direction. A direction connecting the first partial region and the third partial region is along the first direction. The fourth partial region is separated from the second electrode region in the third direction. The first insulating portion is provided between the first electrode region and the first partial region in the second direction, between the first electrode region and a portion of the second partial region in the third direction, between the first electrode region and the third semiconductor region in the third direction, between the first electrode region and the second semiconductor region in the third direction, between the second electrode region and the third partial region in the second direction, and between the second electrode region and the fourth partial region in the third direction. The first insulating portion has a first width and a second width. The first width is a length along the third direction between the first electrode region and the second semiconductor region. The second width is a length along the third direction between the second electrode region and the fourth partial region. The second width is wider than the first width.

According to another embodiment, a method for manufacturing a semiconductor device is disclosed. The method can include forming a first trench in a semiconductor member. The first trench extends in a first direction. The first trench includes a first trench region, a second trench region, and a third trench region. A direction connecting the first trench region and the second trench region is aligned with the first direction. The third trench region is between the first trench region and the second trench region. The first trench has a trench depth along a second direction crossing the first direction. The trench depth includes a first depth in the first trench region, a second depth in the second trench region, and a third depth in the third trench region. The second depth is shallower than the first depth. The third depth is between the first depth and the second depth. The trench depth decreases along a direction from the third trench region toward the second trench region. An opening of the first trench has an opening width along a third direction crossing the first direction and the second direction. The opening width includes a first opening width in the first trench region, a second opening width in the second trench region, and a third opening width in the third trench region. The second opening width is wider than the first opening width. The third opening width is between the first opening width and the second opening width. The opening width increases along the direction from the third trench region toward the second trench region. The method can include forming a first insulating film on a surface of the first trench, and forming a conductive layer in a space remaining in the first trench after the forming of the first insulating film and on another region of the semiconductor member where the first trench is not formed. The conductive layer includes a first conductive region on the first trench region, a second conductive region on the second trench region, and a third conductive region on the third trench region. The method can include performing etch-back of the conductive layer using a mask covering a portion of the second conductive region and a portion of the third conductive region to cause an upper surface of the first conductive region to be lower than an upper surface of the other region of the semiconductor member, cause at least a portion of the portion of the second conductive region and at least a portion of the first insulating film to be separated from each other in the third direction, cause at least a portion of the portion of the third conductive region and at least a portion of the first insulating film to be separated from each other in the third direction, cause a second distance along the third direction between the portion of the second conductive region and a second side surface of the semiconductor member in the second trench region to be longer than a first distance along the third direction between the first conductive region and a first side surface of the semiconductor member in the first trench region, and cause a third distance along the third direction between the portion of the third conductive region and a third side surface of the semiconductor member in the third trench region to be between the first distance and the second distance. In addition, the method can include forming a second insulating film in a space between the second side surface and the portion of the second conductive region and in a space between the third side surface and the portion of the third conductive region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIRST EMBODIMENT

FIG. 1A to FIG. 1D are schematic views illustrating a semiconductor device according to a first embodiment.

Figure 2:
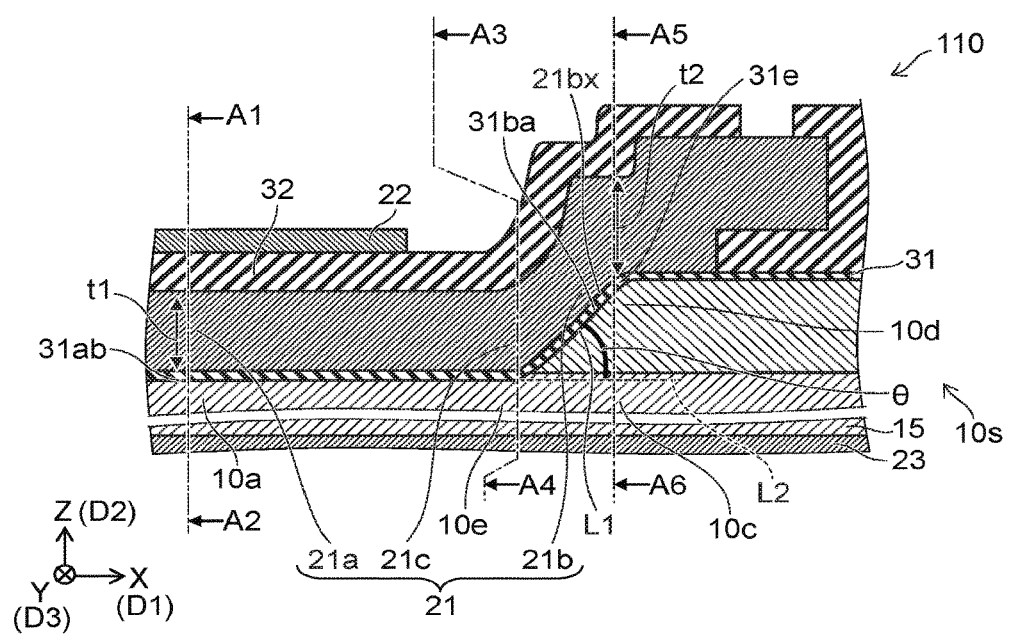
FIG. 2 is a schematic cross-sectional view illustrating the semiconductor device according to the first embodiment.

FIG. 2 is a schematic cross-sectional view illustrating the semiconductor device according to the first embodiment.

Figure 1B:
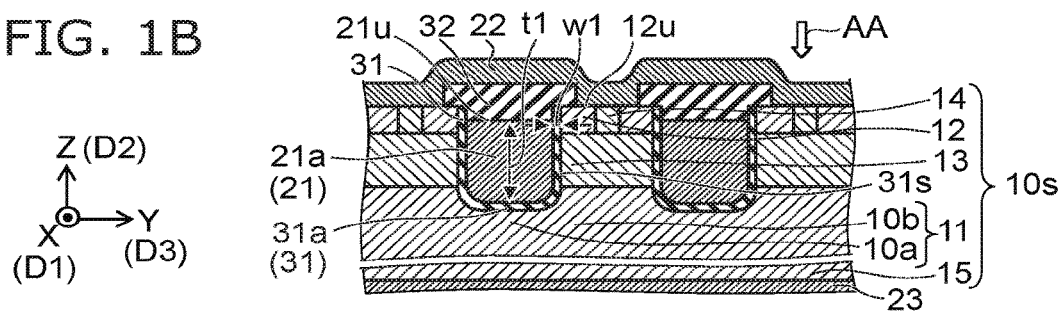
Figure 1C:
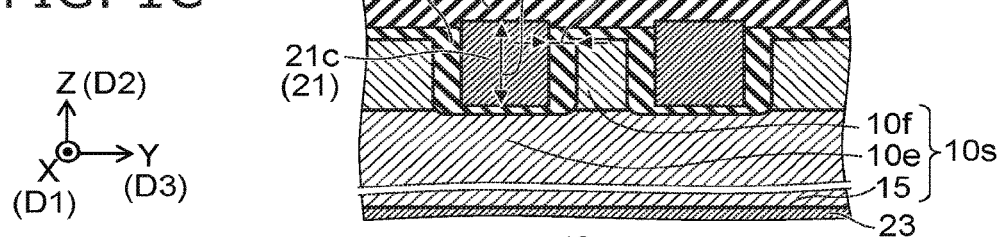
Figure 1D:
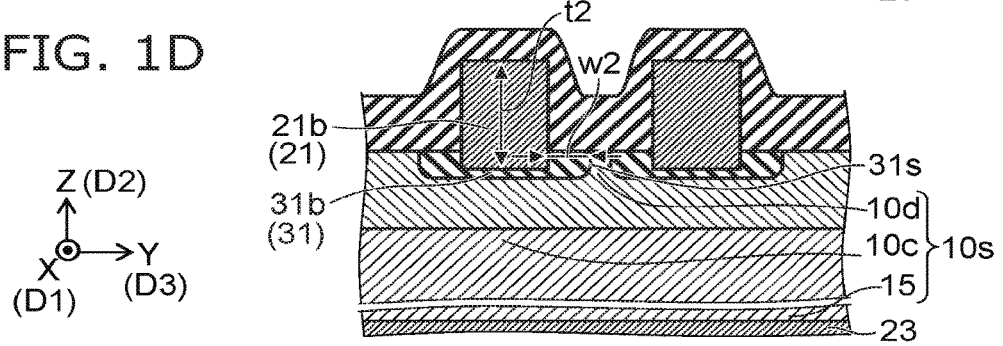

FIG. 1A is a plane when viewed along arrow AA of FIG. 1B. A state in which some of the components are see-through is illustrated in FIG. 1A. FIG. 1B, FIG. 1C, and FIG. 1D are cross-sectional views of line A1-A2, line A3-A4, and line A5-A6 of FIG. 1A, respectively. FIG. 2 is a line B1-B2 cross-sectional view of FIG. 1A.

As shown in FIG. 1A and FIG. 2, the semiconductor device 110 according to the embodiment includes a first electrode 21, a semiconductor layer 10s, and a first insulating portion 31.

The first electrode 21 extends in a first direction D1. The first electrode 21 includes a first electrode region 21a and a second electrode region 21b. The direction that connects the first electrode region 21a and the second electrode region 21b is aligned with the first direction D1.

The first electrode 21 may further include a third electrode region 21c. The third electrode region 21c is positioned between the first electrode region 21a and the second electrode region 21b. For example, the first electrode region 21a corresponds to a region inside an active area. The region that includes the second electrode region 21b and the third electrode region 21c corresponds to an end portion.

Multiple first electrodes 21 are provided as shown in FIG. 1A. The ends of the multiple first electrodes 21 are connected by a fourth electrode region 21d.

As shown in FIG. 1B, the semiconductor layer 10s includes a first semiconductor region 11, a second semiconductor region 12, and a third semiconductor region 13. In the example, the semiconductor layer 10s further includes a fourth semiconductor region 14.

The first semiconductor region 11 includes a first partial region 10a and a second partial region 10b. The first semiconductor region 11 is of a first conductivity type. The first partial region 10a is separated from the first electrode region 21a in a second direction D2. The second direction D2 crosses the first direction D1. For example, the first partial region 10a is positioned under the first electrode region 21a. The direction that connects the first partial region 10a and the second partial region 10b is aligned with a third direction D3. The third direction D3 crosses the first direction D1 and the second direction D2.

The first direction D1 is taken as an X-axis direction. One direction perpendicular to the X-axis direction is taken as a Z-axis direction. A direction perpendicular to the X-axis direction and the Z-axis direction is taken as a Y-axis direction. The second direction D2 is aligned with the Z-axis direction. For example, the third direction D3 is aligned with the Y-axis direction.

The second semiconductor region 12 is separated from the second partial region 10b in the second direction D2. The second semiconductor region 12 is of the first conductivity type.

The third semiconductor region 13 is provided between the second partial region 10b and the second semiconductor region 12 in the second direction D2. The third semiconductor region 13 is of a second conductivity type.

For example, the first conductivity type is an n-type; and the second conductivity type is a p-type. In the embodiment, the first conductivity type may be the p-type; and the second conductivity type may be the n-type. In the example of the description recited below, the first conductivity type is the n-type; and the second conductivity type is the p-type.

As shown in FIG. 1B, the first insulating portion 31 is provided between the first electrode region 21a and the first partial region 10a in the second direction D2. The first insulating portion 31 is provided also between the first electrode region 21a and a portion of the second partial region 10b in the third direction D3. The first insulating portion 31 is provided also between the first electrode region 21a and the third semiconductor region 13 in the third direction D3. The first insulating portion 31 is provided also between the first electrode region 21a and the second semiconductor region 12 in the third direction D3.

As shown in FIG. 1D, the semiconductor layer 10s further includes a third partial region 10c and a fourth partial region 10d.

As shown in FIG. 1D, the first insulating portion 31 is provided also between the second electrode region 21b and the third partial region 10c in the second direction D2. The first insulating portion 31 is provided between the second electrode region 21b and the fourth partial region 10d in the third direction D3.

As shown in FIG. 1D and FIG. 2, the third partial region 10c is separated from the second electrode region 21b in the second direction D2. The direction that connects the first partial region 10a and the third partial region 10c is aligned with the first direction D1.

As shown in FIG. 1D, the fourth partial region 10d is separated from the second electrode region 21b in the third direction D3.

In the example as shown in FIG. 1C, the semiconductor layer 10s further includes a fifth partial region 10e and a sixth partial region 10f. The fifth partial region 10e is separated from the third electrode region 21c in the second direction D2. The sixth partial region 10f is separated from the third electrode region 21c in the third direction D3. The fifth partial region 10e is positioned between the first partial region 10a and the third partial region 10c. The sixth partial region 10f is positioned between the second partial region 10b and the fourth partial region 10d.

In the example as shown in FIG. 1B, the semiconductor layer 10s further includes the fourth semiconductor region 14. The fourth semiconductor region 14 is of the second conductivity type (in the example, the p-type). The second semiconductor region 12 is positioned between the fourth semiconductor region 14 and the first electrode region 21a in the third direction D3. The fourth semiconductor region 14 is continuous with the third semiconductor region 13.

A second electrode 22, a third electrode 23, and a second insulating portion 32 are provided in the example as shown in FIG. 1B. The second electrode 22 is electrically connected to the second semiconductor region 12 and the fourth semiconductor region 14. At least a portion of the second insulating portion 32 is provided between the second electrode 22 and the first electrode region 21a. The third electrode 23 is electrically connected to the first semiconductor region 11. At least a portion of the first semiconductor region 11 is positioned between the first electrode region 21a and the third electrode 23 in the second direction D2. A fifth semiconductor region 15 is further included in the example. The fifth semiconductor region 15 is provided between the first semiconductor region 11 and the third electrode 23. The fifth semiconductor region 15 is of the first conductivity type (in the example, the n-type).

The second electrode 22 and the second insulating portion 32 are not illustrated in FIG. 1A. FIG. 1A illustrates the pattern configuration of the upper portions of the semiconductor layer 10s, the first electrode 21, and the first insulating portion 31.

The semiconductor layer 10s includes, for example, silicon carbide. For example, the first to fourth semiconductor regions 11 to 14 include silicon carbide.

The first electrode 21 functions as, for example, a gate electrode. The second electrode 22 functions as, for example, a source electrode. The third electrode 23 functions as, for example, a drain electrode. At least a portion of the first insulating portion 31 functions as a gate insulating film. The semiconductor device 110 is, for example, a MOS transistor.

As shown in FIG. 1B and FIG. 1D, the first insulating portion 31 has a first width w1 and a second width w2. The first width w1 is the length along the third direction D3 between the first electrode region 21a and the second semiconductor region 12. The second width w2 is the length along the third direction D3 between the second electrode region 21b and the fourth partial region 10d.

In the embodiment, the second width w2 is wider than the first width w1. Thereby, a semiconductor device can be provided in which the insulative characteristics can be improved.

For example, the thickness (the first width w1) of the first insulating portion 31 is set to the thickness of the gate insulating film in the region corresponding to the first electrode region 21a (the region inside the active area). On the other hand, in the region that corresponds to the second electrode region 21b corresponding to the end portion of the gate electrode, the thickness (the second width w2) of the first insulating portion 31 is set to be thick. Thereby, high insulative characteristics of the first insulating portion 31 are obtained in the region corresponding to the second electrode region 21b. For example, the insulation reliability of the end portion of the gate electrode can be increased.

As shown in FIG. 1B, the first insulating portion 31 includes a first insulating portion region 31a. The first insulating portion region 31a is positioned between the first electrode region 21a and the first partial region 10a. For example, the first width w1 is not less than 0.8 times and not more than 5 times the length (the thickness) along the second direction D2 of the first insulating portion region 31a.

On the other hand, as shown in FIG. 1D, the first insulating portion 31 includes a second insulating portion region 31b. The second insulating portion region 31b is positioned between the second electrode region 21b and the third partial region 10c. For example, the length (the thickness) along the second direction D2 of the second insulating portion region 31b is not less than 0.8 times and not more than 5 times the length (the thickness) along the second direction D2 of the first insulating portion region 31a.

In the semiconductor device 110 as shown in FIG. 1C, for example, the first insulating portion 31 is further provided between the third electrode region 21c and the fifth partial region 10e in the second direction D2 and between the third electrode region 21c and a portion of the sixth partial region 10f in the third direction D3. The first insulating portion 31 further has a third width w3. The third width w3 is the length along the third direction D3 between the third electrode region 21c and the portion of the sixth partial region 10f recited above. The third width w3 is between the first width w1 and the second width w2.

For example, the second electrode region 21b and the third electrode region 21c correspond to the connection region of the end portion of the gate electrode. In this region, the width (the length along the third direction D3) between the first electrode 21 and the semiconductor layer 10s increases along the direction from the third electrode region 21c toward the second electrode region 21b. For example, the width (the length along the third direction D3) of the insulating film (the first insulating portion 31) provided between the first electrode 21 and the semiconductor layer 10s increases along the direction from the third electrode region 21c toward the second electrode region 21b. Thereby, high insulative characteristics of the first insulating portion 31 are obtained.

In the example as shown in FIG. 1B, an upper end 21u of the first electrode 21 is positioned lower than the upper end of the semiconductor layer 10s in the region inside the active area. For example, as described above, the first electrode region 21a is positioned between the second insulating portion 32 and the first partial region 10a. In such a case, at least a portion of the second insulating portion 32 overlaps the second semiconductor region 12 in the third direction D3. By causing the upper end 21u of the first electrode region 21a (the gate electrode) to be positioned lower than an upper end 12u of the second semiconductor region 12, high insulative characteristics of the upper end 21u of the first electrode region 21a (the gate electrode) are obtained.

On the other hand, the upper end of the second electrode region 21b is positioned higher than the upper end of the semiconductor layer 10s. The upper end of the third electrode region 21c is positioned higher than the upper end of the semiconductor layer 10s.

As shown in FIG. 1B and FIG. 2, a length along the second direction D2 of the first electrode region 21a is taken as a first length t1. As shown in FIG. 1D and FIG. 2, a length along the second direction D2 of the second electrode region 21b is taken as a second length t2. The first length t1 is shorter than the second length t2.

As shown in FIG. 1C, a length along the second direction D2 of the third electrode region 21c is taken as a third length t3. For example, the third length t3 is shorter than, for example, the second length t2.

For example, the first width w1 recited above may be the distance along the third direction D3 between the second semiconductor region 12 and the upper end of the first electrode region 21a. The second width w2 may be, for example, the distance along the third direction D3 between the second electrode region 21b and the upper end of the fourth partial region 10d. The third width w3 may be, for example, the distance along the third direction D3 between the third electrode region 21c and the upper end of the sixth partial region 10f.

In the example as shown in FIG. 2, the side surface of the semiconductor layer 10s is tilted at the portion corresponding to the second electrode region 21b and the third electrode region 21c.

As shown in FIG. 2, the first insulating portion 31 includes an end insulating portion 31e. The end insulating portion 31e is provided between the second electrode region 21b and a portion of the semiconductor layer 10s (e.g., a portion of the fourth partial region 10d) in the first direction D1. The second electrode region 21b includes an electrode region side surface 21bx. The electrode region side surface 21bx overlaps the end insulating portion 31e in the first direction D1. The electrode region side surface 21bx is tilted with respect to the second direction D2 (the Z-axis direction). The angle between the X-Y plane and the electrode region side surface 21bx is, for example, 80 degrees or less. This angle may be, for example, 30 degrees or more.

For example, the distance along the first direction D1 between the electrode region side surface 21bx and the first electrode region 21a increases along the direction from the first partial region 10a toward the first electrode region 21a (the direction upward from below).

By providing such a tilt, for example, the electric field strength that is applied to the first insulating portion 31 at the vicinity of the end insulating portion 31e can be weaker. Thereby, high insulative characteristics of the first insulating portion 31 are obtained.

As shown in FIG. 2, the first insulating portion 31 has a first insulating portion surface 31ba. The first insulating portion surface 31ba overlaps the second electrode region 21b and the portion of the semiconductor layer 10s recited above (e.g., the portion of the fourth partial region 10d) in the first direction D1. The first insulating portion surface 31ba is tilted with respect to the second direction D2 (the Z-axis direction). For example, the first insulating portion 31 has a second insulating portion surface 31ab. The second insulating portion surface 31ab overlaps the first partial region 10a in the second direction D2. The second insulating portion surface 31ab overlaps the first electrode region 21a in the second direction D2. A line that includes the first insulating portion surface 31ba when the first insulating portion surface 31ba is cut by a second plane (e.g., the X-Z plane) including the first direction D1 and the second direction D2 is taken as a first line L1. A line that includes the second insulating portion surface 31ab when the second insulating portion surface 31ab is cut by the second plane is taken as a second line L2. The angle between the first line L1 and the second line L2 is taken as an angle θ. The angle θ is less than 90 degrees. For example, the angle θ is not less than 30 degrees and not more than 80 degrees.

In the embodiment, for example, the fourth partial region 10d is of the second conductivity type (in the example, the p-type). For example, the sixth partial region 10f is of the second conductivity type (in the example, the p-type).

An example of a method for manufacturing the semiconductor device 110 according to the embodiment will now be described.

FIG. 3A to FIG. 3E, FIG. 4A to FIG. 4E, FIG. 5A to FIG. 5E, FIG. 6A to FIG. 6E, FIG. 7A to FIG. 7E, FIG. 8A to FIG. 8E, FIG. 9A to FIG. 9E, FIG. 10A to FIG. 10E, FIG. 11A to FIG. 11E, and FIG. 12A to FIG. 12E are schematic views illustrating the method for manufacturing the semiconductor device according to the first embodiment.

FIG. 3A to FIG. 12A are plan views. FIG. 3B to FIG. 12B are line B1-B2 cross-sectional views of FIG. 3A to FIG. 12A respectively. FIG. 3C to FIG. 12C are line A1-A2 cross-sectional views of FIG. 3A to FIG. 12A respectively. FIG. 3D to FIG. 12D are line A3-A4 cross-sectional views of FIG. 3A to FIG. 12A respectively. FIG. 3E to FIG. 12E are line A5-A6 cross-sectional views of FIG. 3A to FIG. 12A respectively.

Figure 3A:
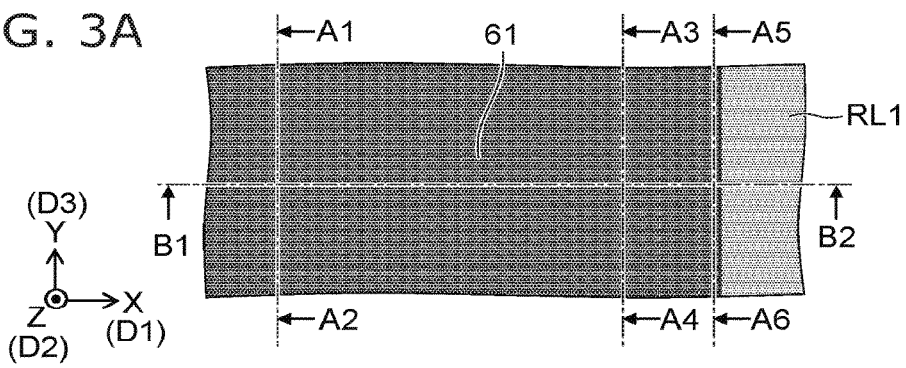
FIG. 3A to FIG. 3E are schematic views illustrating a method for manufacturing the semiconductor device according to the first embodiment.
Figure 3B:
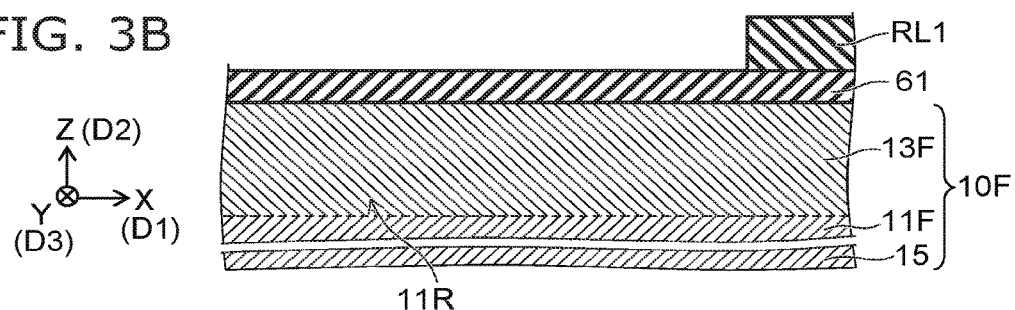
Figure 3C:
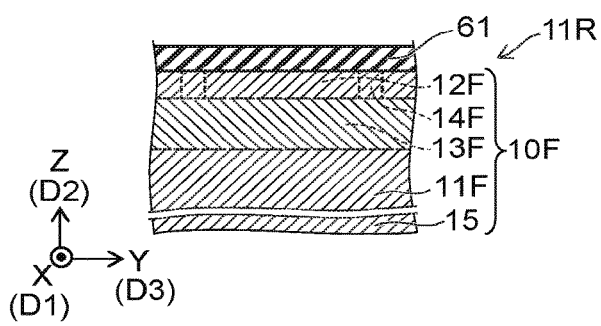
Figures 3D, 3E:
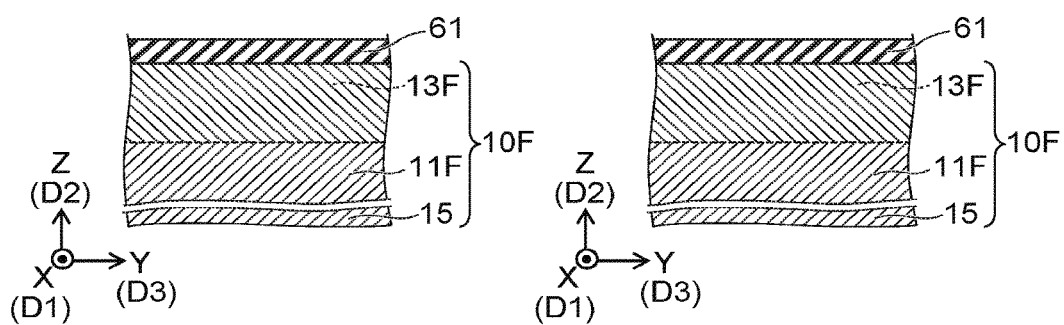

A semiconductor member 10F is prepared as shown in FIG. 3A to FIG. 3E. The semiconductor member 10F includes a first semiconductor layer region 11R. The first semiconductor layer region 11R is the region where a first trench described below is formed. As shown in FIG. 3C, the first semiconductor layer region 11R includes a first semiconductor film 11F, a second semiconductor film 12F, and a third semiconductor film 13F. In the example, the first semiconductor layer region 11R further includes a fourth semiconductor film 14F.

The first semiconductor film 11F is of the first conductivity type (e.g., the n-type). The second semiconductor film 12F is provided on at least a portion of the first semiconductor film 11F. The second semiconductor film 12F is of the first conductivity type (e.g., the n-type). The third semiconductor film 13F is provided between the second semiconductor film 12F and at least a portion of the first semiconductor film 11F. The third semiconductor film 13F is of the second conductivity type (e.g., the p-type). The fourth semiconductor film 14F is provided on another portion of the first semiconductor film 11F. The fourth semiconductor film 14F is of the second conductivity type. The fourth semiconductor film 14F is connected to the third semiconductor film 13F.

The semiconductor member 10F may include the fifth semiconductor region 15. The fifth semiconductor region 15 is, for example, a substrate. The semiconductor member 10F includes, for example, SiC.

In the drawings hereinbelow, the multiple semiconductor films that are included in the first semiconductor layer region 11R are not illustrated as appropriate for easier viewing of the drawings. The first trench that is described below is formed in such a semiconductor member 10F. For example, the first trench is formed as follows.

As shown in FIG. 3A to FIG. 3E, a first film 61 is formed on the semiconductor member 10F. For example, silicon oxide is used as the first film 61. A first resist layer RL1 that has a prescribed configuration is formed on the first film 61. The first resist layer RL1 covers, for example, the outer edge portion of the semiconductor member 10F (and the first film 61). The central portion of the first film 61 is exposed from the opening of the first resist layer RL1.

Figure 4A:
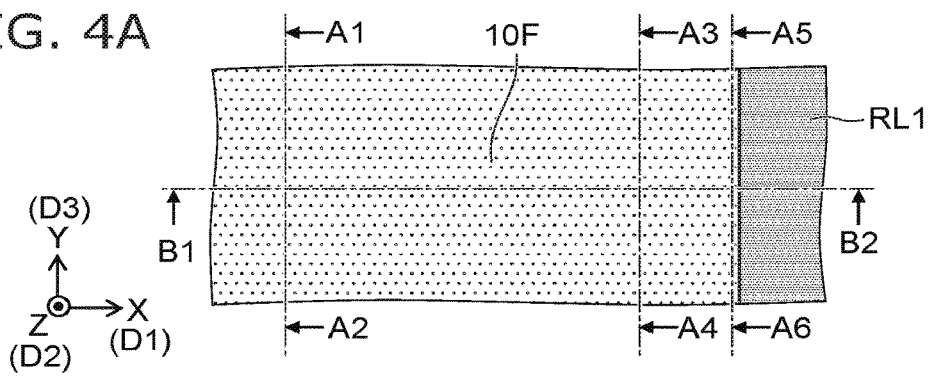
FIG. 4A to FIG. 4E are schematic views illustrating the method for manufacturing the semiconductor device according to the first embodiment.
Figure 4B:
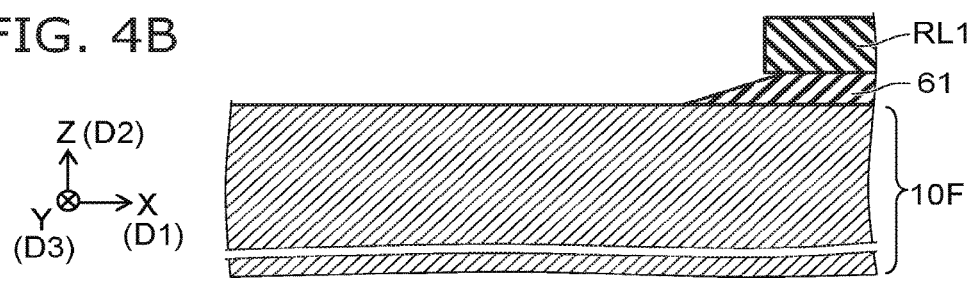
Figure 4C:
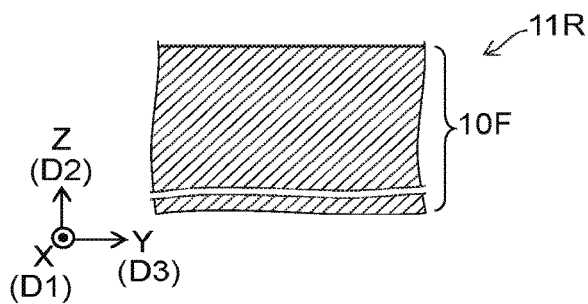
Figure 4D:
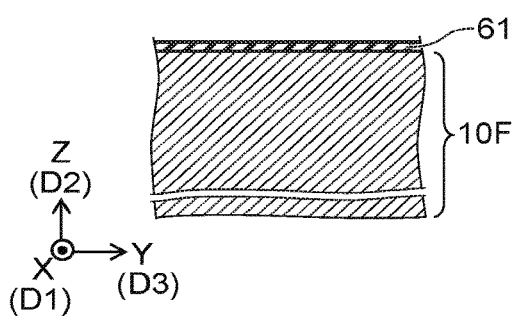
Figure 4E:
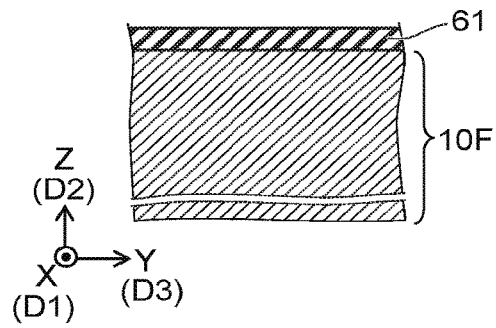

As shown in FIG. 4A to FIG. 4E, a portion of the first film 61 is removed by wet etching. For example, hydrofluoric acid or the like is used in the wet etching. As shown in FIG. 4B, an oblique surface of the first film 61 is tilted. The first resist layer RL1 is removed.

Figure 5A:
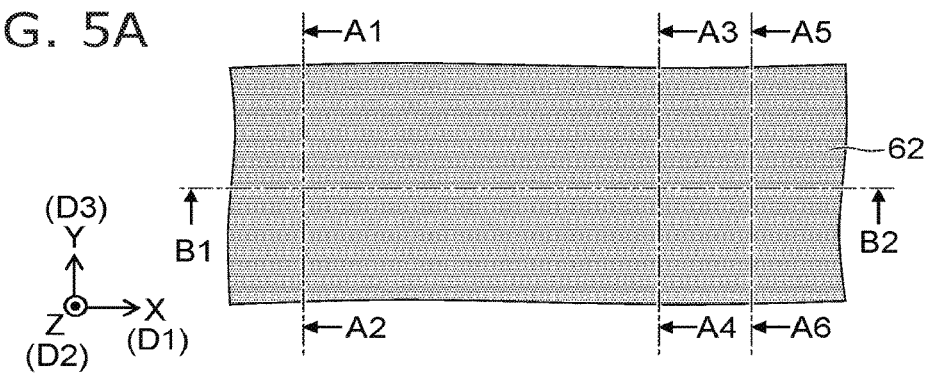
FIG. 5A to FIG. 5E are schematic views illustrating the method for manufacturing the semiconductor device according to the first embodiment.
Figure 5B:
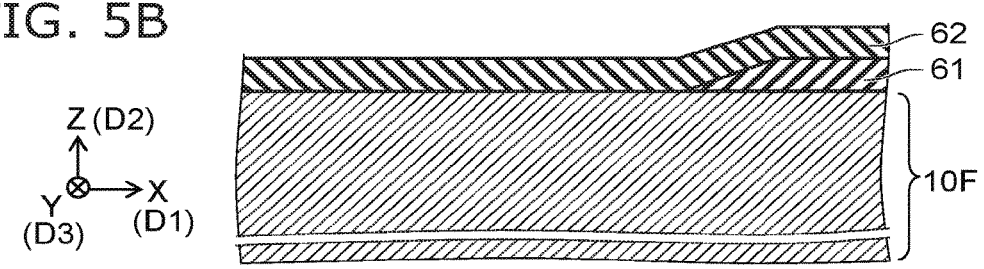
Figure 5C:
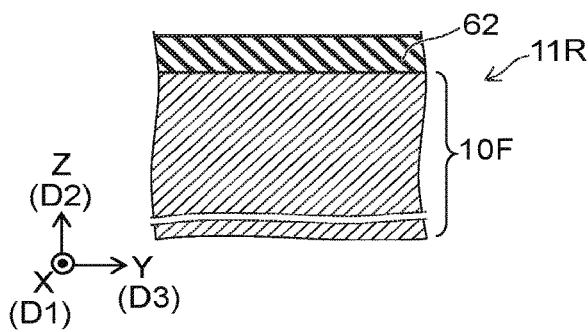
Figure 5D:
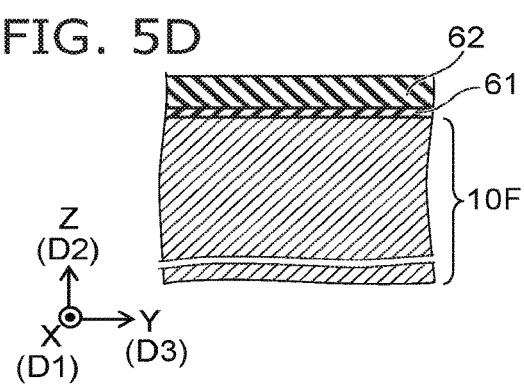
Figure 5E:
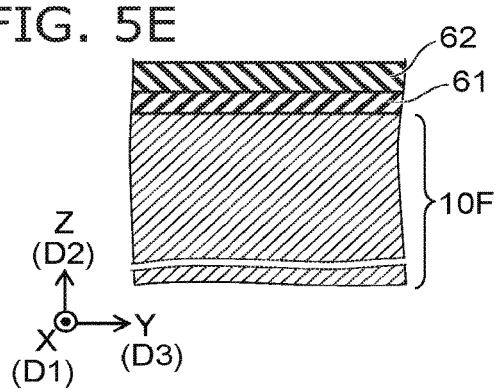

As shown in FIG. 5A to FIG. 5E, a second film 62 is formed on the semiconductor member 10F and the remaining portion of the first film 61. The second film 62 includes, for example, silicon oxide. As shown in FIG. 5B, a portion of the surface (the vicinity of the outer edge) of the second film 62 is tilted according to the tilted side surface of the first film 61.

Figure 6A:
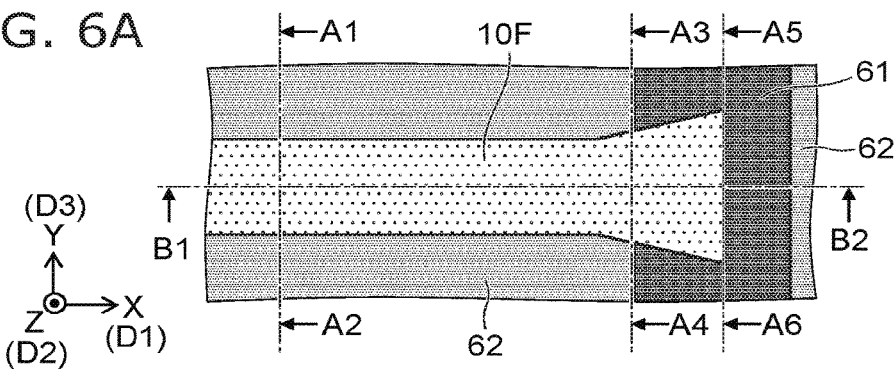
FIG. 6A to FIG. 6E are schematic views illustrating the method for manufacturing the semiconductor device according to the first embodiment.
Figure 6B:
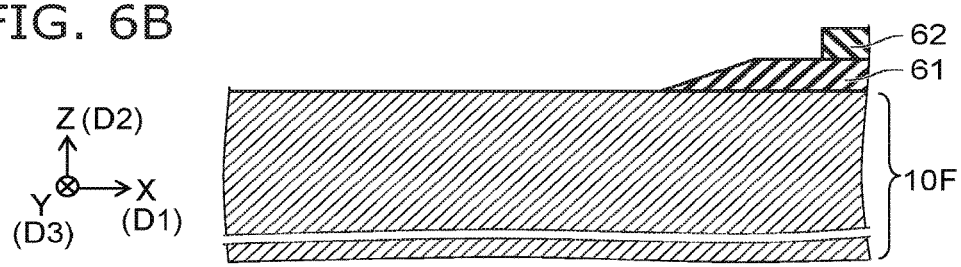
Figure 6C:
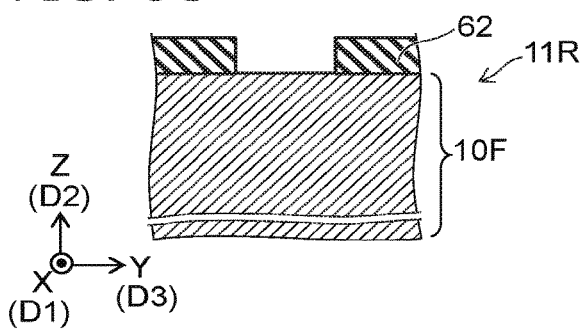
Figure 6D:
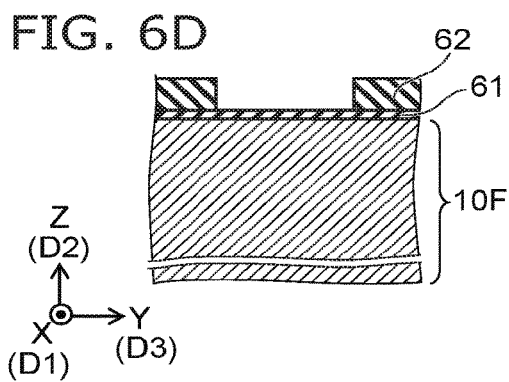
Figure 6E:
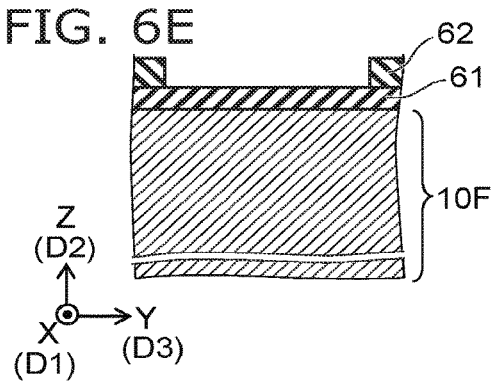

As shown in FIG. 6A to FIG. 6E, a portion of the second film 62 and a portion of the first film 61 are removed by dry etching using a not-illustrated mask. The dry etching includes, for example, reactive ion etching, etc. The semiconductor member 10F is exposed in the region where the portion of the second film 62 is removed. As shown in FIG. 6B, the first film 61 that has a tilted oblique surface is exposed.

Figure 7A:
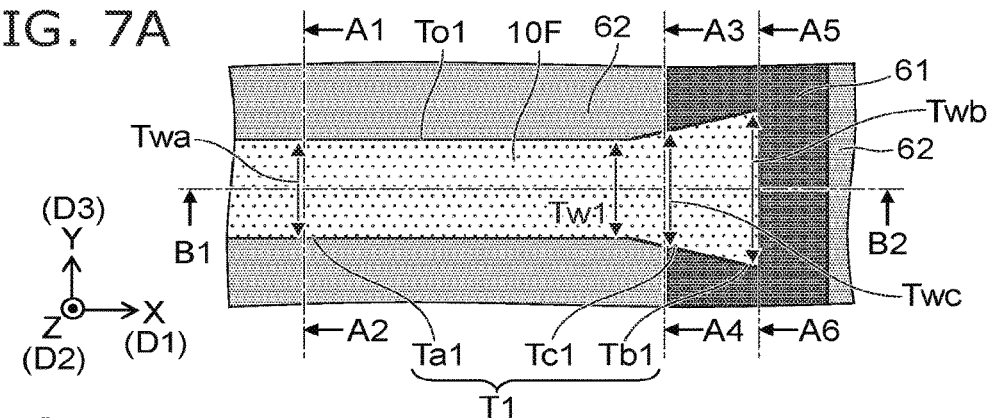
FIG. 7A to FIG. 7E are schematic views illustrating the method for manufacturing the semiconductor device according to the first embodiment.
Figure 7B:
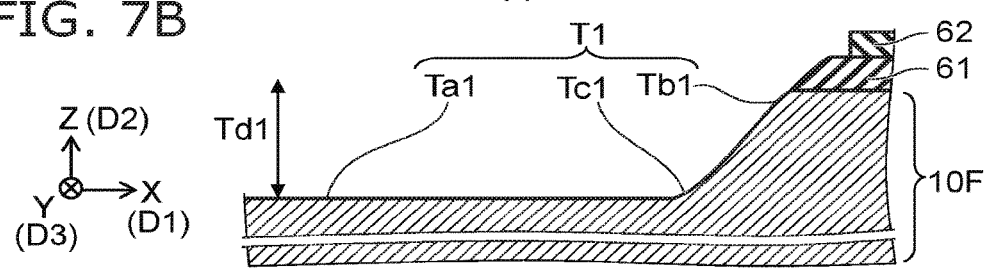
Figure 7C:
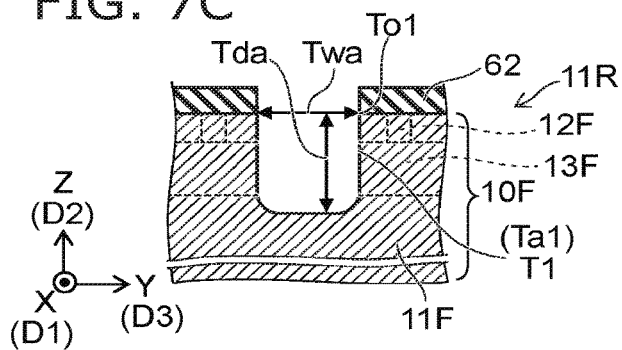
Figure 7D:
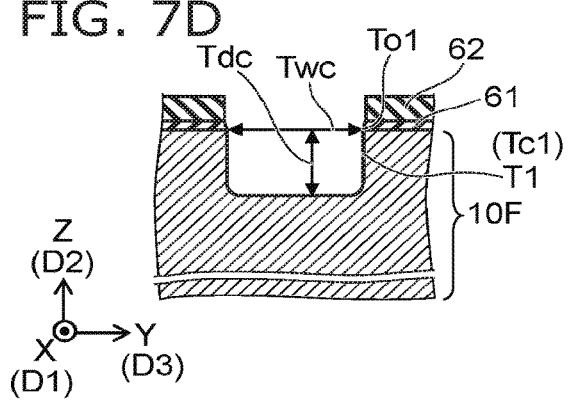
Figure 7E:
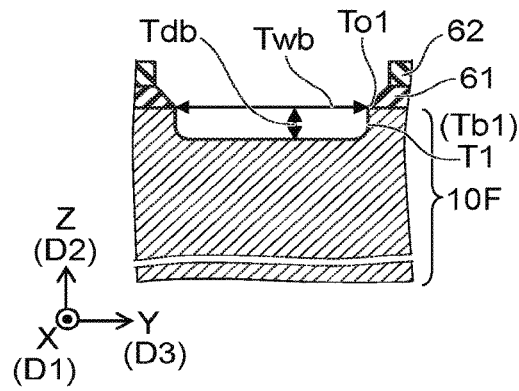
Figure 8A:
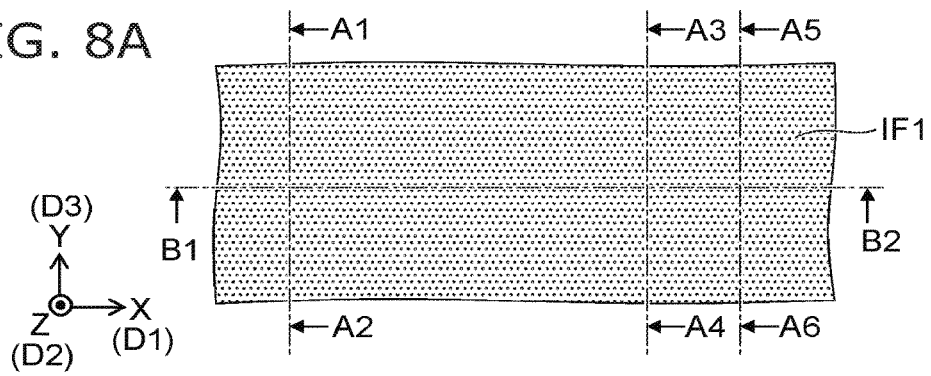
FIG. 8A to FIG. 8E are schematic views illustrating the method for manufacturing the semiconductor device according to the first embodiment.
Figure 8B:
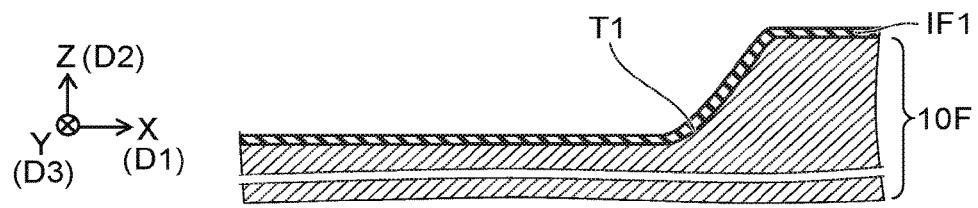
Figure 8C:
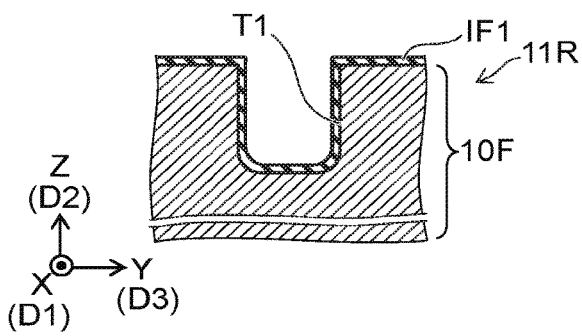
Figure 8D:
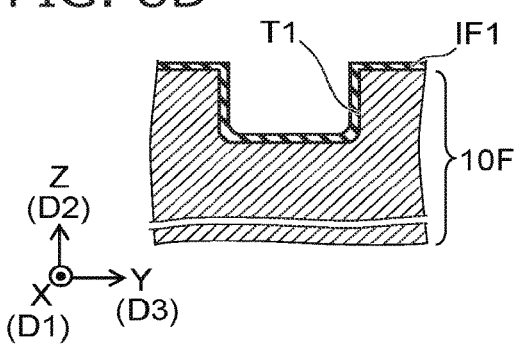
Figure 8E:
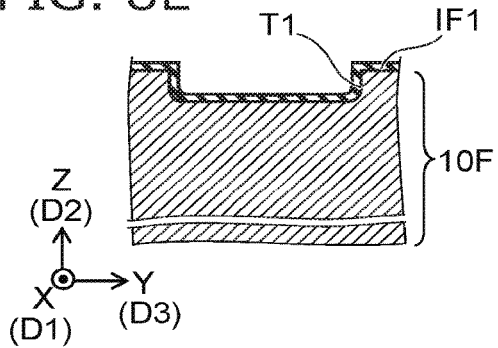
Figure 9A:
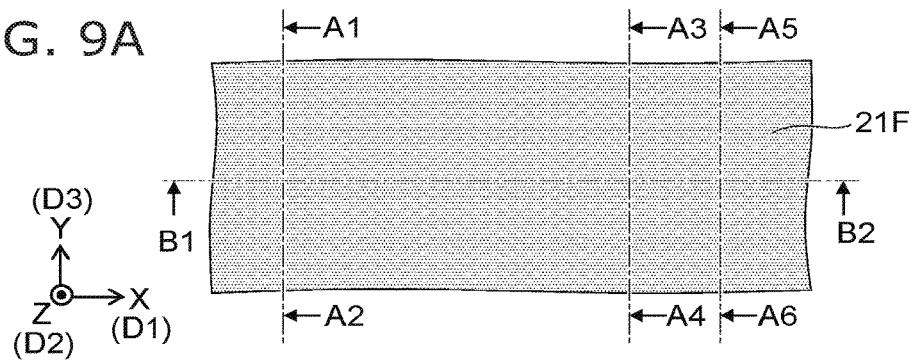
FIG. 9A to FIG. 9E are schematic views illustrating the method for manufacturing the semiconductor device according to the first embodiment.
Figure 9B:
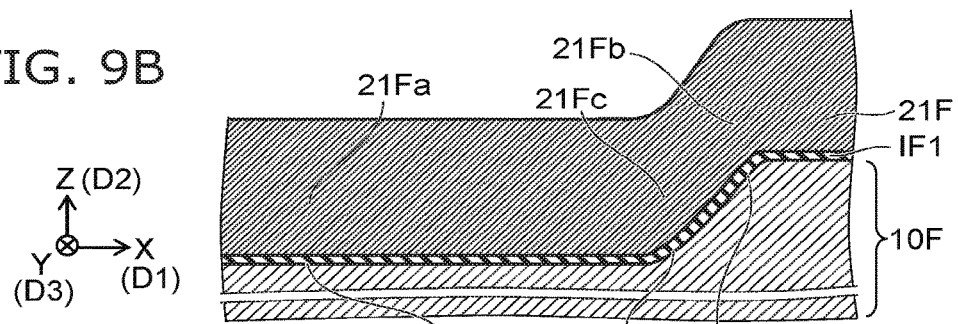
Figure 9C:
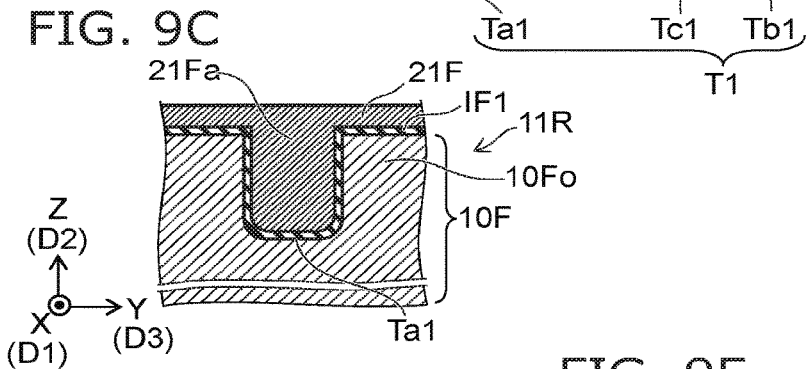
Figure 9D:
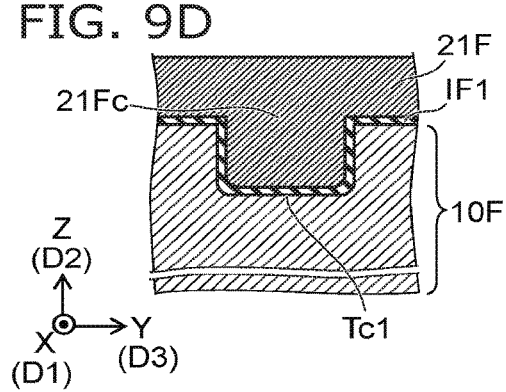
Figure 9E:
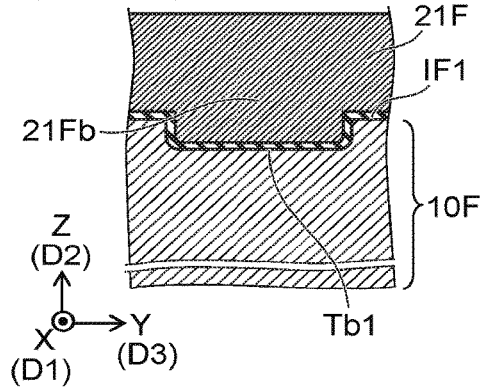
Figure 10A:
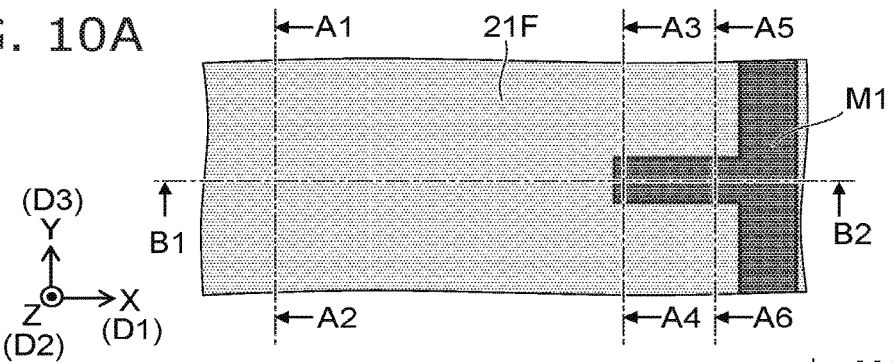
FIG. 10A to FIG. 10E are schematic views illustrating the method for manufacturing the semiconductor device according to the first embodiment.
Figure 10B:
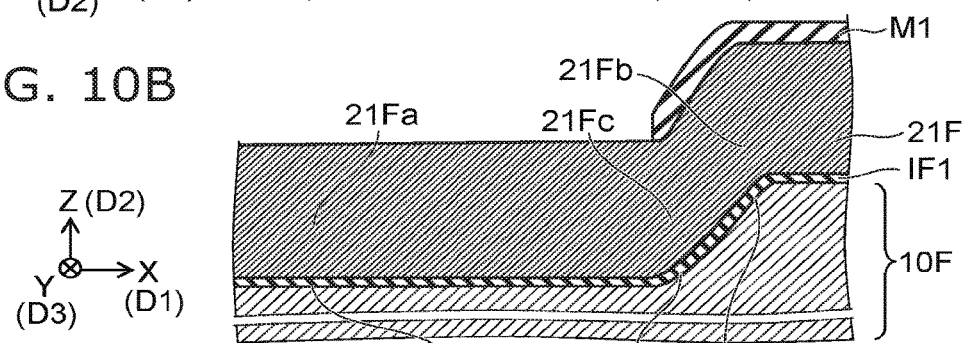
Figure 10C:
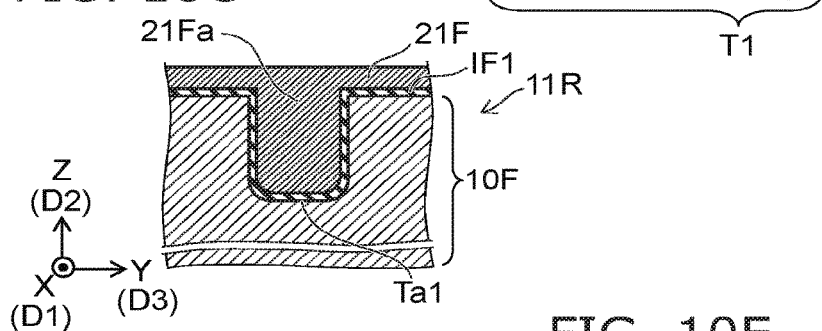
Figure 10D:
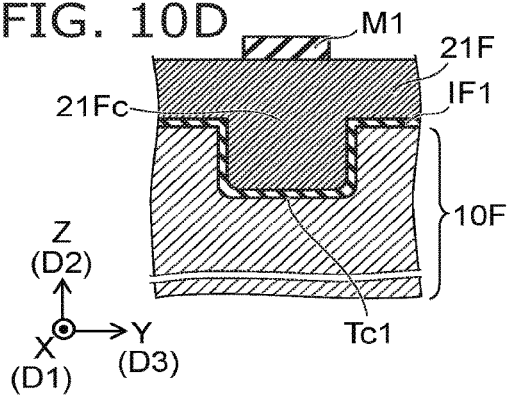
Figure 10E:
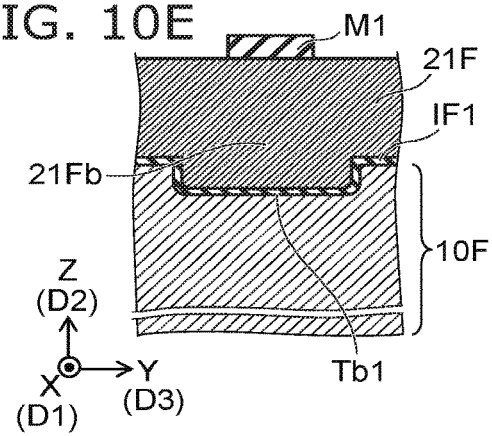

As shown in FIG. 7A to FIG. 7E, the semiconductor member 10F is removed using the second film 62 and the first film 61 as a mask. The removal includes, for example, dry etching using reactive ion etching. Thereby, a first trench T1 is formed. As shown in FIG. 7B, the configuration of the first trench T1 reflects the configuration of the first film 61 having the tilted oblique surface.

As shown in FIG. 7B to FIG. 7E, the first trench T1 is deep at the central portion of the first semiconductor layer region 11R. The first trench T1 is shallow at the end portion.

The manufacturing method according to the embodiment includes forming such a first trench T1 in the semiconductor member 10F.

As shown in FIG. 7A, the first trench T1 extends in the first direction D1. The first trench T1 includes a first trench region Ta1, a second trench region Tb1, and a third trench region Tc1. The direction that connects the first trench region Ta1 and the second trench region Tb1 is aligned with the first direction D1. The third trench region Tc1 is between the first trench region Ta1 and the second trench region Tb1.

The first trench T1 has a trench depth Td1 (referring to FIG. 7B). The trench depth Td1 is a length along the second direction D2 (e.g., the Z-axis direction). The second direction D2 crosses the first direction D1. The trench depth Td1 includes a first depth Tda (referring to FIG. 7C), a second depth Tdb (referring to FIG. 7E), and a third depth Tdc (referring to FIG. 7D). The first depth Tda is the depth in the first trench region Ta1. The second depth Tdb is the depth in the second trench region Tb1. The third depth Tdc is the depth in the third trench region Tc1.

The second depth Tdb is shallower than the first depth Tda. The third depth Tdc is between the first depth Tda and the second depth Tdb. The trench depth Td1 decreases along the direction from the third trench region Tc1 toward the second trench region Tb1. In other words, the side surface of the first trench T1 is tilted.

The bottom portion of the first trench region Ta1 is positioned lower than the lower end portion of the third semiconductor film 13F.

On the other hand, as shown in FIG. 7A, an opening To1 of the first trench T1 has an opening width Tw1. The opening width Tw1 is the length along the third direction D3. The third direction D3 crosses the first direction D1 and the second direction D2. The opening width Tw1 includes a first opening width Twa (referring to FIG. 7C), a second opening width Twb (referring to FIG. 7E), and a third opening width Twc (referring to FIG. 7D). The first opening width Twa is the width in the first trench region Ta1. The second opening width Twb is the width in the second trench region Tb1. The third opening width Twc is the width in the third trench region Tc1. As shown in FIG. 7A, the second opening width Twb is wider than the first opening width Twa. The third opening width Twc is between the first opening width Twa and the second opening width Twb. The opening width Tw1 increases along the direction from the third trench region Tc1 toward the second trench region Tb1.

The first film 61 and the second film 62 are removed after forming such a first trench T1. Subsequently, the following are further implemented.

As shown in FIG. 8A to FIG. 8E, a first insulating film IF1 is formed on the surface of the first trench T1. In the example, the first insulating film IF1 is formed also on the upper surface of the semiconductor member 10F. For example, silicon oxide is used as the first insulating film IF1.

A conductive layer 21F is formed as shown in FIG. 9A to FIG. 9E. The conductive layer 21F is formed in the remaining space of the first trench T1 after the formation of the first insulating film IF1. The conductive layer 21F is formed also on another region 10Fo of the semiconductor member 10F where the first trench T1 is not formed. For example, polysilicon is formed as the conductive layer 21F. The conductive layer 21F includes a first conductive region 21Fa, a second conductive region 21Fb, and a third conductive region 21Fc. The first conductive region 21Fa is positioned on the first trench region Ta1. The second conductive region 21Fb is positioned on the second trench region Tb1. The third conductive region 21Fc is positioned on the third trench region Tc1.

A mask M1 is formed as shown in FIG. 10A to FIG. 10E. The mask M1 covers a portion of the second conductive region 21Fb and a portion of the third conductive region 21Fc. The mask M1 is not provided on the first conductive region 21Fa. In the example, the mask M1 is provided also on the portion used to form the fourth electrode region 21d (referring to FIG. 1A).

Etch-back of the conductive layer 21F is performed using the mask M1. Then, the mask M1 is removed.

Figure 11A:
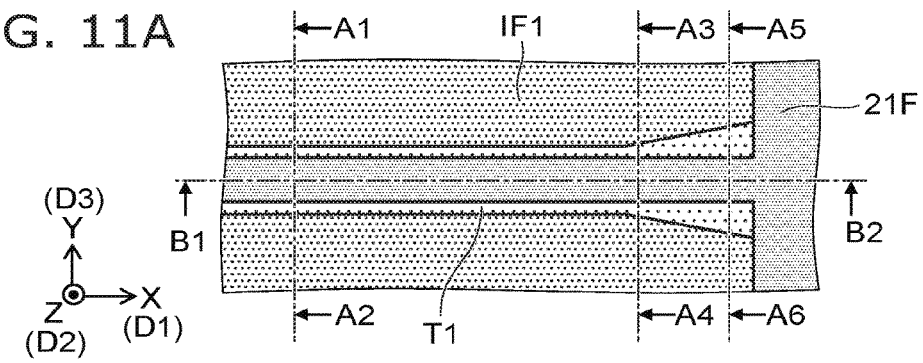
FIG. 11A to FIG. 11E are schematic views illustrating the method for manufacturing the semiconductor device according to the first embodiment.
Figure 11B:
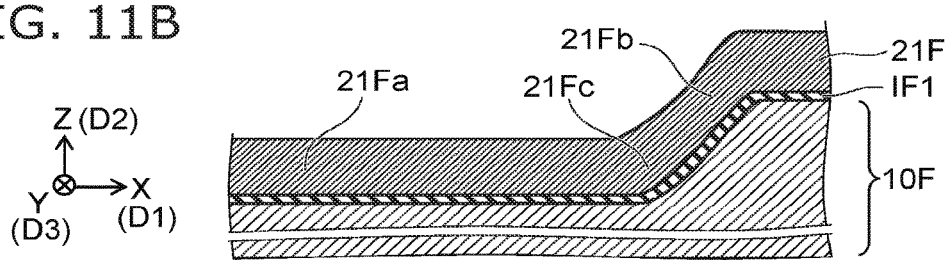
Figure 11C:
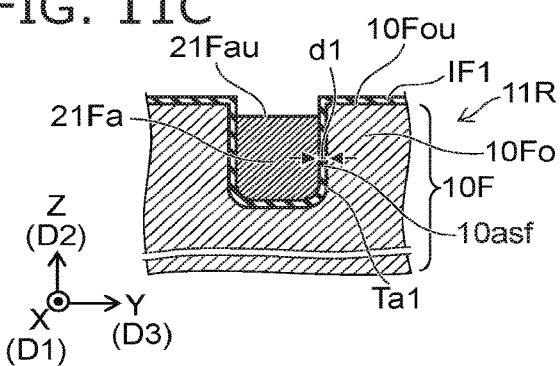

Thereby, the structure shown in FIG. 11A to FIG. 11E is formed. As shown in FIG. 11C, an upper surface 21Fau of the first conductive region 21Fa is caused to be lower than an upper surface 10Fou of the other region 10Fo recited above.

Figure 11D:
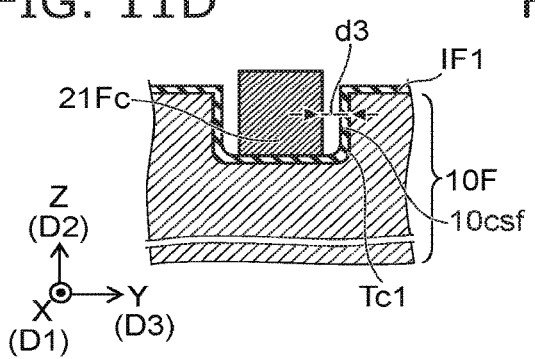
Figure 11E:
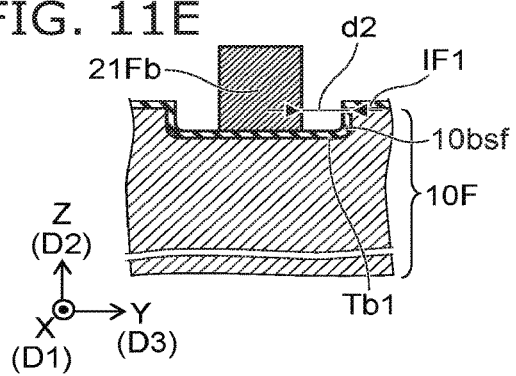

As shown in FIG. 11E, at least a portion of the portion of the second conductive region 21Fb recited above and at least a portion of the first insulating film IF1 are separated from each other in the third direction (the Y-axis direction). As shown in FIG. 11D, at least a portion of the portion of the third conductive region 21Fc recited above and at least a portion of the first insulating film IF1 are separated from each other in the Y-axis direction.

As shown in FIG. 11C, the semiconductor member 10F has a side surface (a first side surface 10asf) in the first trench region Ta1. As shown in FIG. 11E, the semiconductor member 10F has a side surface (a second side surface 10*bsf*) in the second trench region Tb1. As shown in FIG. 11D, the semiconductor member 10F has a side surface (a third side surface 10*csf*) in the third trench region Tc1.

As shown in FIG. 11C, the distance along the third direction D3 between the first side surface 10*asf* and the first conductive region 21Fa is taken as a first distance d1. As shown in FIG. 11E, the distance along the third direction D3 between the second side surface 10*bsf* and the portion of the second conductive region 21Fb recited above is taken as a second distance d2. As shown in FIG. 11D, the distance along the third direction D3 between the third side surface 10*csf* and the portion of the third conductive region 21Fc recited above is taken as a third distance d3.

In the manufacturing method, the second distance d2 is caused to be longer than the first distance d1. The third distance d3 is caused to be between the first distance d1 and the second distance d2.

In the manufacturing method, a gap occurs between the second side surface 10*bsf* and the portion of the second conductive region 21Fb recited above. A gap occurs between the third side surface 10*csf* and the portion of the third conductive region 21Fc recited above.

In the manufacturing method as described below, an insulating material is filled into these gaps.

Figure 12A:
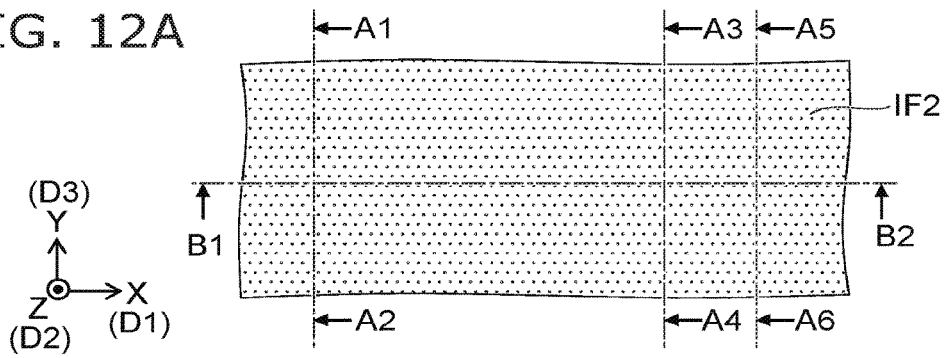
FIG. 12A to FIG. 12E are schematic views illustrating the method for manufacturing the semiconductor device according to the first embodiment.
Figure 12B:
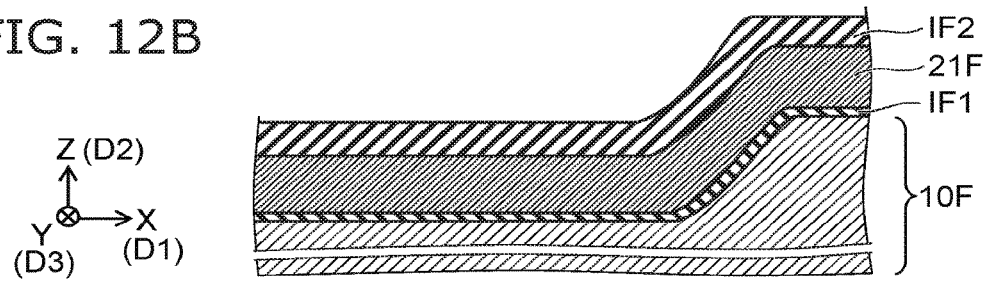
Figure 12C:
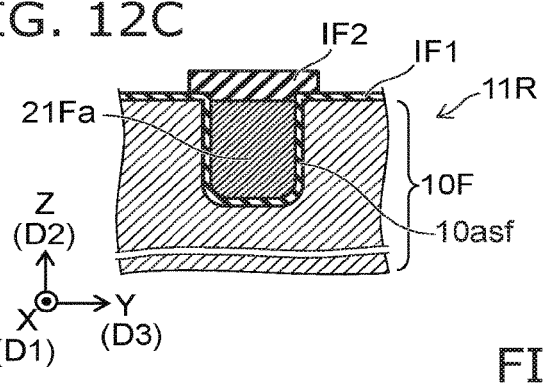
Figure 12D:
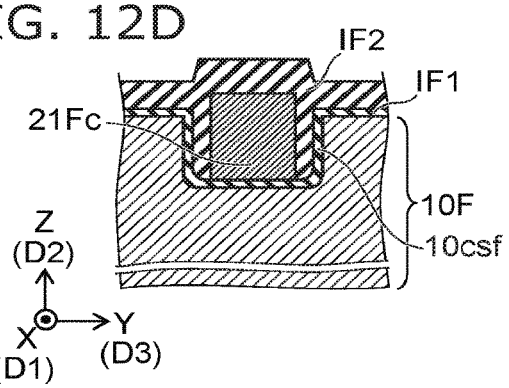
Figure 12E:
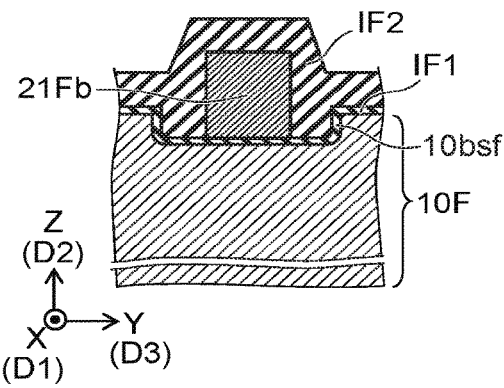

A second insulating film IF2 is formed as shown in FIG. 12A to FIG. 12E. As shown in FIG. 12E, the second insulating film IF2 is formed in the space between the second side surface 10*bsf* and the portion of the second conductive region 21Fb recited above. As shown in FIG. 12D, the second insulating film IF2 is formed in the space between the third side surface 10*csf* and the portion of the third conductive region 21Fc recited above. As shown in FIG. 12C to FIG. 12E, the second insulating film IF2 may be provided also on the first conductive region 21Fa, on the second conductive region 21Fb, and on the third conductive region 21Fc. The second insulating film IF2 includes, for example, silicon oxide.

The manufacturing method may further include forming an electrode (the second electrode 22) electrically connected to the second semiconductor film 12F after forming the second insulating film IF2. For example, a hole is provided in the second insulating film IF2. The hole communicates with the second semiconductor film 12F (and the fourth semiconductor film 14F). A material that is used to form the second electrode 22 is provided on the second insulating film IF2 and inside the hole.

The third electrode 23 is further formed on the lower surface of the fifth semiconductor region 15. Thus, the semiconductor device 110 can be formed. The conductive layer 21F that is filled into the first trench T1 is used to form the first electrode 21 (e.g., the gate electrode). A portion of the first insulating film IF1 is used to form the gate insulating film. According to the manufacturing method according to the embodiment, a method for manufacturing a semiconductor device can be provided in which the insulative characteristics can be improved.

Figure 13:
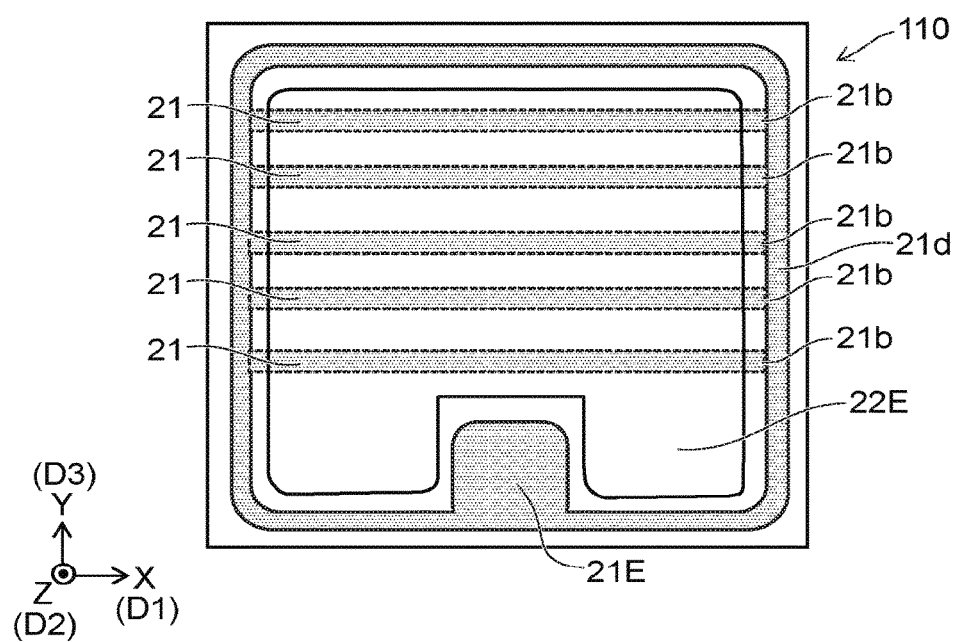
FIG. 13 is a schematic plan view illustrating the semiconductor device according to the first embodiment.

FIG. 13 is a schematic plan view illustrating the semiconductor device according to the first embodiment.

In the semiconductor device 110 as shown in FIG. 13, the fourth electrode region 21*d* that is connected to the second electrode region 21*b* of the first electrode 21 may extend along the outer edge of the semiconductor device 110. A first electrode pad 21E that is electrically connected to the fourth electrode region 21*d* may be provided. A second electrode pad 22E may be provided. The second electrode pad 22E is electrically connected to the second semiconductor film 12F (i.e., the second semiconductor region 12) via the hole provided in the second insulating film IF2 recited above.

Figure 14A:
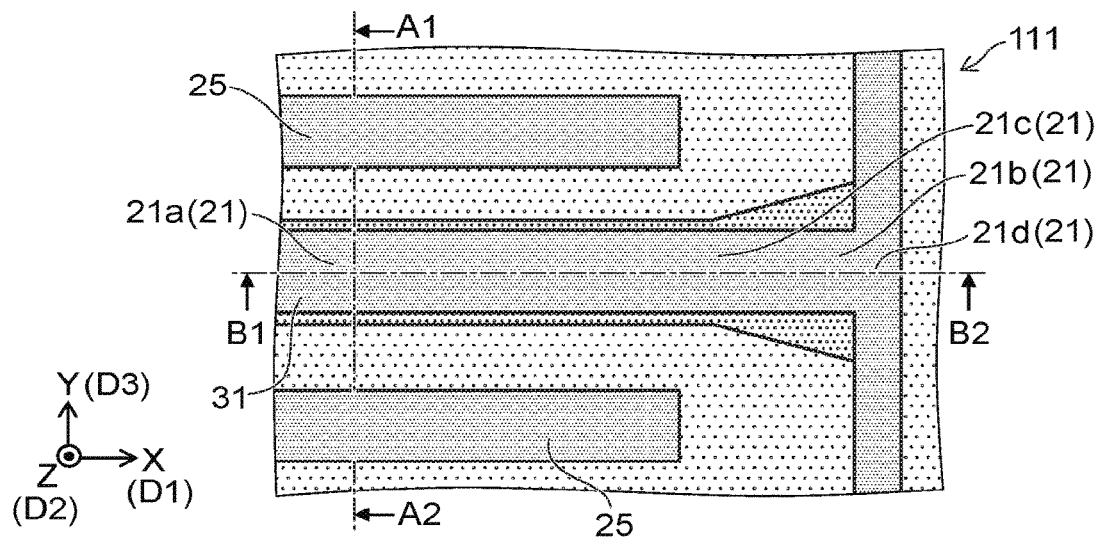
FIG. 14A and FIG. 14B are schematic views illustrating another semiconductor device according to the first embodiment.
Figure 14B:
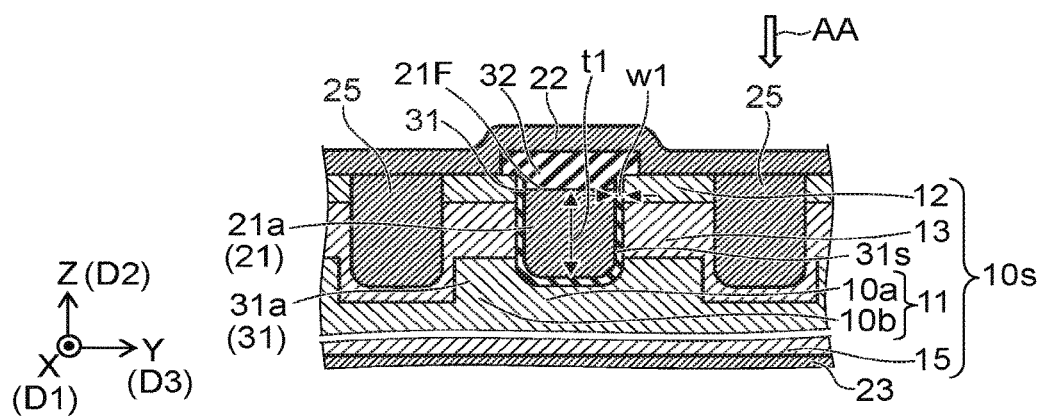

FIG. 14A and FIG. 14B are schematic views illustrating another semiconductor device according to the first embodiment.

FIG. 14A is a plane when viewed along arrow AA of FIG. 14B. A state in which some of the components are see-through is illustrated in FIG. 14A. FIG. 14B is a cross-sectional view along line A1-A2 of FIG. 14A.

As shown in FIG. 14A and FIG. 14B, the semiconductor device 111 according to the embodiment further includes a conductive portion 25 in addition to the first electrode 21, the semiconductor layer 10*s*, and the first insulating portion 31.

The conductive portion 25 is separated from the first electrode region 21*a* of the first electrode 21 in the third direction D3. The conductive portion 25 extends in the first direction D1. The conductive portion 25 is electrically connected to the third semiconductor region 13.

As shown in FIG. 14B, at least a portion of the second semiconductor region 12 is positioned between the first electrode region 21*a* and at least a portion of the conductive portion 25 in the third direction D3.

Two conductive portions 25 are illustrated in the example as shown in FIG. 14A. The first electrode 21 is provided between the two conductive portions 25. Multiple first electrodes 21 may be provided. In such a case, the multiple first electrodes 21 and the multiple conductive portions 25 are arranged alternately along the third direction D3.

Due to the conductive portion 25, the electric field that is applied to the first insulating portion 31 at the lower portion of the first electrode region 21*a* can be low. Thereby, the insulative characteristics can be improved further.

SECOND EMBODIMENT

Figure 15:
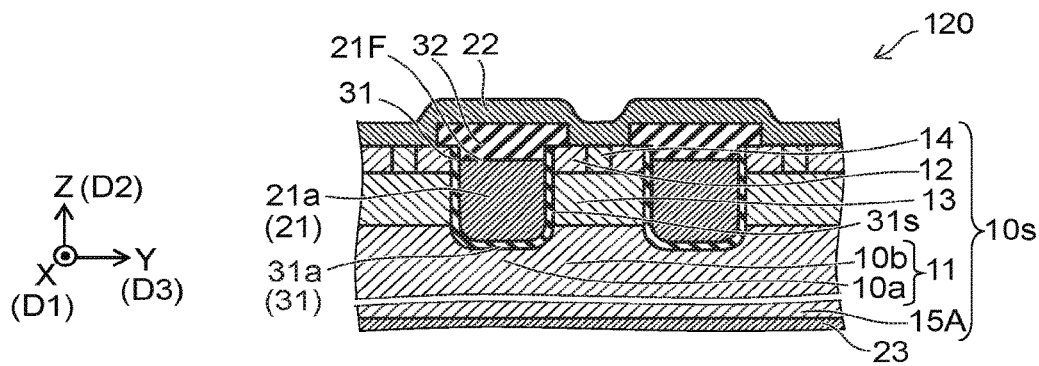
FIG. 15 is a schematic cross-sectional view illustrating a semiconductor device according to a second embodiment.

FIG. 15 is a schematic cross-sectional view illustrating a semiconductor device according to a second embodiment.

As shown in FIG. 15, a fifth semiconductor region 15A is provided in the semiconductor device 120 according to the embodiment. Otherwise, the semiconductor device 120 is similar to the semiconductor device 110. The fifth semiconductor region 15A is of the second conductivity type (e.g., the p-type).

Figure 16:
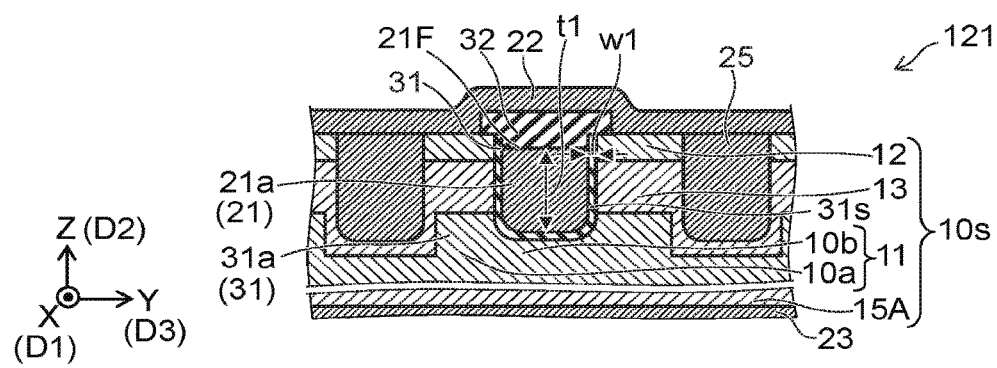
FIG. 16 is a schematic cross-sectional view illustrating another semiconductor device according to the second embodiment.

FIG. 16 is a schematic cross-sectional view illustrating another semiconductor device according to the second embodiment.

As shown in FIG. 16, the fifth semiconductor region 15A is provided in the semiconductor device 121 according to the embodiment as well. Otherwise, the semiconductor device 121 is similar to the semiconductor device 110. The fifth semiconductor region 15A is of the second conductivity type (e.g., the p-type).

The semiconductor devices 120 and 121 are, for example, IGBTs (Insulated Gate Bipolar Transistors). In the semiconductor devices 120 and 121 as well, a semiconductor device can be provided in which the insulative characteristics can be improved.

In the embodiment, the thickness (the length along the third direction D3) of the insulating portion provided between the gate electrode and the semiconductor layer 10*s* in the width direction of the gate electrode (the third direction D3) is set to be thicker in the end portion than in the region inside the active area. Further, the side surface of the semiconductor layer 10*s* (the trench) is tilted at the end portion of the gate electrode. Thereby, the insulative characteristics of the insulating portion can be improved. For example, the electric field concentration is relaxed.

For example, in the embodiment, the source region can be shallow. Thereby, for example, the channel can be shorter than that of a reference example in which the tilt of the opening of the trench is gradual. The channel can be shorter while improving the insulative characteristics.

According to the embodiments, a semiconductor device and a method for manufacturing the semiconductor device can be provided in which the insulative characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, semiconductor regions, partial regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode extending along a first direction and including a first electrode region and a second electrode region, a direction connecting the first electrode region and the second electrode region being along the first direction;
   a semiconductor layer including
      a first semiconductor region including a first partial region and a second partial region and being of a first conductivity type, the first partial region being separated from the first electrode region in a second direction crossing the first direction, a direction connecting the first partial region and the second partial region being aligned with a third direction crossing the first direction and the second direction,
      a second semiconductor region separated from the second partial region in the second direction, the second semiconductor region being of the first conductivity type,
      a third semiconductor region provided between the second partial region and the second semiconductor region in the second direction, the third semiconductor region being of a second conductivity type,
      a third partial region separated from the second electrode region in the second direction, a direction connecting the first partial region and the third partial region being along the first direction, and
      a fourth partial region separated from the second electrode region in the third direction; and
   a first insulating portion provided between the first electrode region and the first partial region in the second direction, between the first electrode region and a portion of the second partial region in the third direction, between the first electrode region and the third semiconductor region in the third direction, between the first electrode region and the second semiconductor region in the third direction, between the second electrode region and the third partial region in the second direction, and between the second electrode region and the fourth partial region in the third direction, the first insulating portion having a first width and a second width, the first width being a length along the third direction between the first electrode region and the second semiconductor region, the second width being a length along the third direction between the second electrode region and the fourth partial region, the second width being wider than the first width,
   wherein
   the first insulating portion includes an end insulating portion,
   the end insulating portion is provided between the second electrode region and a portion of the semiconductor layer in the first direction,
   the second electrode region has an electrode region side surface overlapping the end insulating portion in the first direction, and
   the electrode region side surface is tilted with respect to the second direction.

2. The device according to claim 1, further comprising a second insulating portion,
   the first electrode region being positioned between the second insulating portion and the first partial region,
   at least a portion of the second insulating portion overlapping the second semiconductor region in the third direction.

3. The device according to claim 1, wherein a first length along the second direction of the first electrode region is shorter than a second length along the second direction of the second electrode region.

4. The device according to claim 1, wherein
the end insulating portion has a first insulating portion surface,
the first insulating portion surface overlaps the second electrode region and the portion of the semiconductor layer in the first direction, and
the first insulating portion surface is tilted with respect to the second direction.

5. The device according to claim 4, wherein
the first insulating portion has a second insulating portion surface overlapping the first partial region in the second direction, and
a second angle between a first line and a second line is not less than 30 degrees and not more than 80 degrees, the first line including the first insulating portion surface when the first insulating portion surface is cut by a second plane including the first direction and the second direction, the second line including the second insulating portion surface when the second insulating portion surface is cut by the second plane.

6. The device according to claim 1, wherein the fourth partial region is of the second conductivity type.

7. The device according to claim 1, wherein the first to third semiconductor regions include silicon carbide.

8. The device according to claim 1, further comprising a conductive portion extending in the first direction, being separated from the first electrode region in the third direction, and being electrically connected to the third semiconductor region,
at least a portion of the second semiconductor region being positioned between the first electrode region and at least a portion of the conductive portion in the third direction.

9. The device according to claim 1, wherein a distance along the first direction between the electrode region side surface and the first electrode region increases along a direction from the first partial region toward the first electrode region.

10. The device according to claim 1, further comprising a third electrode electrically connected to the first semiconductor region,
at least a portion of the first semiconductor region being positioned between the first electrode region and the third electrode in the second direction.

11. A semiconductor device, comprising:
a first electrode extending along a first direction and including a first electrode region and a second electrode region, a direction connecting the first electrode region and the second electrode region being along the first direction;
a semiconductor layer including
a first semiconductor region including a first partial region and a second partial region and being of a first conductivity type, the first partial region being separated from the first electrode region in a second direction crossing the first direction, a direction connecting the first partial region and the second partial region being aligned with a third direction crossing the first direction and the second direction,
a second semiconductor region separated from the second partial region in the second direction, the second semiconductor region being of the first conductivity type,
a third semiconductor region provided between the second partial region and the second semiconductor region in the second direction, the third semiconductor region being of a second conductivity type,
a third partial region separated from the second electrode region in the second direction, a direction connecting the first partial region and the third partial region being along the first direction, and
a fourth partial region separated from the second electrode region in the third direction; and
a first insulating portion provided between the first electrode region and the first partial region in the second direction, between the first electrode region and a portion of the second partial region in the third direction, between the first electrode region and the third semiconductor region in the third direction, between the first electrode region and the second semiconductor region in the third direction, between the second electrode region and the third partial region in the second direction, and between the second electrode region and the fourth partial region in the third direction, the first insulating portion having a first width and a second width, the first width being a length along the third direction between the first electrode region and the second semiconductor region, the second width being a length along the third direction between the second electrode region and the fourth partial region, the second width being wider than the first width,
wherein
the first electrode further includes a third electrode region between the first electrode region and the second electrode region,
the semiconductor layer further includes:
a fifth partial region separated from the third electrode region in the second direction; and
a sixth partial region separated from the third electrode region in the third direction,
the fifth partial region is positioned between the first partial region and the third partial region,
the sixth partial region is positioned between the second partial region and the fourth partial region,
the first insulating portion is further provided between the third electrode region and the fifth partial region in the second direction and between the third electrode region and a portion of the sixth partial region in the third direction,
the first insulating portion further has a third width,
the third width is a length along the third direction between the third electrode region and the portion of the sixth partial region, and
the third width is between the first width and the second width.

12. The device according to claim 11, wherein
the first insulating portion includes an end insulating portion,
the end insulating portion is provided between the second electrode region and a portion of the semiconductor layer in the first direction,
the second electrode region has an electrode region side surface overlapping the end insulating portion in the first direction, and
the electrode region side surface is tilted with respect to the second direction.

13. The device according to claim 11, wherein the third width increases along a direction from the first partial region toward the first electrode region.

14. The device according to claim 11, wherein the first to third semiconductor regions include silicon carbide.

15. The device according to claim 11, wherein
the semiconductor layer further includes a fourth semiconductor region of the second conductivity type, the second semiconductor region is positioned between the fourth semiconductor region and the first electrode region in the third direction, and the fourth semiconductor region is continuous with the third semiconductor region.

16. A semiconductor device, comprising:

a first electrode extending along a first direction and including a first electrode region and a second electrode region, a direction connecting the first electrode region and the second electrode region being along the first direction;

a semiconductor layer including
- a first semiconductor region including a first partial region and a second partial region and being of a first conductivity type, the first partial region being separated from the first electrode region in a second direction crossing the first direction, a direction connecting the first partial region and the second partial region being aligned with a third direction crossing the first direction and the second direction,
- a second semiconductor region separated from the second partial region in the second direction, the second semiconductor region being of the first conductivity type,
- a third semiconductor region provided between the second partial region and the second semiconductor region in the second direction, the third semiconductor region being of a second conductivity type,
- a third partial region separated from the second electrode region in the second direction, a direction connecting the first partial region and the third partial region being along the first direction, and
- a fourth partial region separated from the second electrode region in the third direction; and a first insulating portion provided between the first electrode region and the first partial region in the second direction, between the first electrode region and a portion of the second partial region in the third direction, between the first electrode region and the third semiconductor region in the third direction, between the first electrode region and the second semiconductor region in the third direction, between the second electrode region and the third partial region in the second direction, and between the second electrode region and the fourth partial region in the third direction, the first insulating portion having a first width and a second width, the first width being a length along the third direction between the first electrode region and the second semiconductor region, the second width being a length along the third direction between the second electrode region and the fourth partial region, the second width being wider than the first width, wherein the semiconductor layer further includes a fourth semiconductor region of the second conductivity type, the second semiconductor region is positioned between the fourth semiconductor region and the first electrode region in the third direction, and the fourth semiconductor region is continuous with the third semiconductor region.

17. The device according to claim 16, further comprising a second electrode electrically connected to the second semiconductor region and the fourth semiconductor region.

18. The device according to claim 16, further comprising:

a second electrode electrically connected to the second semiconductor region and the fourth semiconductor region, and a second insulating portion provided between the second electrode and the first electrode region.

19. The device according to claim 16, wherein the first insulating portion includes an end insulating portion, the end insulating portion is provided between the second electrode region and a portion of the semiconductor layer in the first direction, the second electrode region has an electrode region side surface overlapping the end insulating portion in the first direction, and the electrode region side surface is tilted with respect to the second direction.

20. The device according to claim 16, wherein the first to third semiconductor regions include silicon carbide.

* * * * *